United States Patent [19]
Nayak et al.

[11] Patent Number: 5,920,104
[45] Date of Patent: Jul. 6, 1999

[54] REDUCING REVERSE SHORT-CHANNEL EFFECT WITH LIGHT DOSE OF P WITH HIGH DOSE OF AS IN N-CHANNEL LDD

[75] Inventors: Deepak Kumar Nayak, Santa Clara; Felicia Heiler, San Jose; Rajat Rakkhit, Milpitas, all of Calif.

[73] Assignee: Advanced Micro Devices, Inc., Sunnyvale, Calif.

[21] Appl. No.: 08/922,504

[22] Filed: Sep. 3, 1997

Related U.S. Application Data

[63] Continuation of application No. 08/621,420, Mar. 25, 1996, abandoned.

[51] Int. Cl.[6] .............................. H01L 29/76; H01L 29/94
[52] U.S. Cl. ........................................... 257/408; 257/344
[58] Field of Search ...................................... 257/344, 408

[56] References Cited

U.S. PATENT DOCUMENTS

| 4,935,379 | 6/1990 | Toyoshima | 257/344 |
| 5,512,771 | 4/1996 | Hiroki et al. | 257/344 |

FOREIGN PATENT DOCUMENTS

| 0 187 016 | 7/1986 | European Pat. Off. | 257/344 |
| 0 596 468 A2 | 5/1994 | European Pat. Off. | 257/344 |
| 60234367 | 11/1985 | Japan | 257/408 |
| 61234077 | 10/1986 | Japan | 257/344 |
| 04-179160 | 6/1992 | Japan | 257/345 |
| 04-333239 | 11/1992 | Japan | 257/408 |
| 5267338 | 10/1993 | Japan | 257/408 |

*Primary Examiner*—Steven H. Loke
*Attorney, Agent, or Firm*—H. Donald Nelson

[57] ABSTRACT

Submicron nLDD CMOS logic devices with improved current drive and reduced reverse short-channel effects having heavily doped As and lightly doped P nLDD region.

7 Claims, 8 Drawing Sheets

REDUCING REVERSE SHORT-CHANNEL EFFECT WITH LIGHT DOSE OF P WITH HIGH DOSE OF AS IN N-CHANNEL LDD

This application is a continuation, of application Ser. No. 08/621,420 filed Mar. 25, 1996, now abandoned.

BACKGROUND OF THE INVENTION

1. Field of the Invention

This invention relates generally to the manufacture of high performance semiconductor devices and, more particularly, to the manufacture of high performance sub micron semiconductor devices and, even more particularly, to the manufacture of sub-half micron n-channel CMOS logic devices with improved current drive and reduced reverse short-channel effects.

2. Discussion of the Related Art

To achieve the higher performance required by end users of semiconductors, such as computer users, it is necessary for the semiconductor manufacturers to provide faster and smaller integrated circuits in faster chips. In addition, end users of semiconductors have demanded more functions on smaller chips. This, for example, has resulted in the requirement to increase the density of transistors on chips on each new generation of semiconductors.

Two of the major goals of MOSFET scaling are to increase the density and the speed of the integrated circuits in which the scaled-down devices are to be used. To increase density the physical dimensions have to be reduced which means smaller channel lengths and widths. To increase the speed of the integrated circuits, the MOSFET saturation drain current $I_{DSAT}$ must be increased to allow faster charging and discharging of parasitic capacitances. The long-channel MOSFET models derived for the pre-submicron long-channel MOSFETs predict that $I_{DSAT}$ should continue to increase with a decrease in either the channel length L or the gate oxide thickness $t_{ox}$. The long-channel MOSFET models predict that $I_{DSAT}$ should continue to increase indefinitely as L and $t_{ox}$ are decreased, seeming to imply that only the limitations of process technology, i.e., not device effects, prevent the manufacture of smaller, higher-performing MOSFETs.

However, as process technology improved to the point where devices could be fabricated with gate lengths smaller than approximately 2 μm, MOSFETs began to exhibit phenomena not predicted by the long-channel MOSFET models. Such phenomena are called "short-channel effects." One such unpredicted phenomena is the effect of gate dimensions on threshold voltage $V_T$. There are three basic short-channel effects on the threshold voltage of MOSFETs: (1) the short-channel threshold-voltage shift; (2) narrow gate width effects on threshold voltage; and (3) the reverse short-channel threshold voltage shift.

Figure 1:
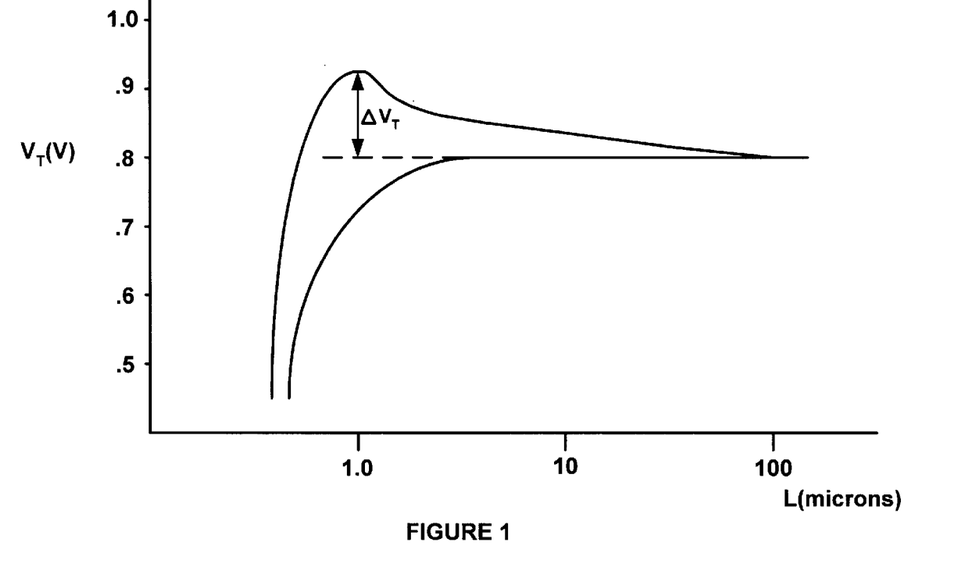
FIG. 1 is a graphical representation of the reverse short-channel effect shown in relation to the predicted effect.

It has been found that as the channel length dimension L is reduced to less than 2 μm the difference between the predicted threshold voltage of MOSFETs and the actual measured threshold becomes significant. Typically, the threshold voltage $V_T$ decreases as L is reduced. However, in some situations it has been found that threshold voltage $V_T$ initially increases with decreasing channel length, beginning at about L=2–3 μm, contrary to what would be predicted. This phenomenon is called "reverse short channel effect" (RSCE), "$V_T$ roll-up," or "anomalous threshold behavior." After $V_T$ reaches a maximum value due to RSCE, at about 0.7 μm, $V_T$ declines as channel lengths are further decreased. This decline is called "$V_T$ roll off." It is theorized that the two-dimensional effects that are responsible for $V_T$ roll off eventually overcome the effects causing $V_T$ roll-up and dominate at the shorter channel lengths. In fact, another observed unexplained short channel phenomenon is that the rate of $V_T$ roll off with shorter $L_{eff}$ (effective channel length) is much faster than can be explained by the conventional models of laterally uniform channel doping. FIG. 1 illustrates the observed characteristics of the reverse short-channel effects on threshold voltage. The characteristic curve represented by 10 shows the region of roll-up at 12 and roll off at 14. The characteristic curve represented by 16 illustrates the expected decrease in threshold voltage $V_T$ with decreased channel length. The difference between the value represented by line 18 and the curve 10 is represented by delta $V_T$. There have been different explanations for the roll-up effect, however, while several of the models seem to provide good quantitative agreement with experimental observations of the reverse short-channel effect, a consensus has not been achieved as to the cause of the reverse short-channel effect. The following models have been proposed as explanations of the reverse short-channel effect.

The first model proposes that the reverse short-channel effect is due to lateral dopant nonuniformity at the channel $Si-SiO_2$ interface arising from enhanced diffusion of channel dopants caused by interstitial injection during poly reoxidation, salicide formation, or implant damage. This model was based on the fact that this effect was initially observed in nMOSFETs fabricated with two boron channel implants, a shallow boron implant for adjustment of the threshold voltage and a deeper boron implant for suppression of punchthrough. After the polysilicon gate is defined by etching and the source/drain regions are implanted, the thermal oxidation step (re-ox) is performed for several purposes, one of which is to reoxidize the source/drain regions. However, the reoxidation step also detrimentally impacts the $V_T$ characteristic of MOSFETs which employ lightly-doped drains (LDD). Therefore, the reoxidation step must be optimized for this type of device. The injection of interstitials which accompanies thermal oxidation causes oxidation-enhanced-diffusion (OED) of dopants in the vicinity of the growing oxide. This diffusion of dopants is enhanced not only under the oxidizing regions, (the source/drain regions) but also in the adjacent channel region due to lateral diffusion of the injection Si self-interstitials into the channel region. The oxidation-enhanced-diffusion causes boron to diffuse more rapidly which brings more boron from the deep buried peak concentration level to the surface near the edges of the channel. As a result, the boron surface concentration becomes larger at the channel edges which gives rise to an overall increase in $V_T$ if the channel length L becomes small enough to make these regions a significant fraction of the channel length. The $V_T$ roll-up has also been observed in MOSFETs in which a salicide is formed on the source/drain regions to reduce the sheet resistance of the source and drain. It has been suggested that during the silicide formation vacancies are injected and these enhance the dopant diffusion of the boron in the dual-implant profile. This also gives rise to a lateral nonuniform lateral distribution of boron along the channel surface. Similar to the oxidation-enhanced-diffusion model, this would increase $V_T$ as the MOSFET channel length is decreased.

Another proposed explanation is a model which suggests that the reverse short-channel effect arises from boron segregation to implant damaged regions at the edge of the channel. The first model discussed above does not explain the observation that $V_T$ roll-up occurs in MOSFETs with uniformly doped channel regions. The above models would predict that boron surface concentrations would decrease near the edges of the channels and thus $V_T$ would decrease monotonically with decreasing channel length in MOSFETs uniform channel regions. Because of the shortcoming of the above model, this model suggests another phenomenon as being responsible for the reverse short-channel effect roll-up and the subsequent enhanced roll-off effects as the channel length is decreased. This other phenomenon is that the reverse short-channel effect is caused by the depletion of boron from the channel region by strong segregation of the boron into the adjacent source and drain regions during the source/drain implant-activation anneal. This segregation is thought to occur as a result of the presence of crystal defects caused by the source/drain implant step. It is theorized that the boron has a higher local solubility in the defective regions and will diffuse to them during the anneal steps performed after the source/drain implant.

A further model attributes the reverse short-channel effect to transient enhanced diffusion of channel dopants to the silicon surface arising from implant damage. This model proposes that the effect is associated with damage from the LDD implant, i.e., that the point defects (interstitials) are assumed to be created by the LDD implant which diffuse laterally into the channel region during the relatively low-temperature step used to deposit the CVD interlevel dielectric layer needed to create the gate-sidewall spacers. As these point defects are primarily created at a depth corresponding to the end-of-range damage, the interstitial concentration peak would exist beneath the surface and, thus, a retrograde profile of interstitials in the channel will arise. Since the dopant diffusivity is proportional to the interstitial concentration, the retrograde interstitial concentration profile will cause a net boron diffusion flux toward the surface even if a flat boron dopant profile exists in the vertical direction. This would result in an increase of $V_T$. The diffusion of boron toward the channel surface from this effect would be a transient phenomenon because the interstitials are eventually annihilated during the anneal.

Although the above models each provides a proposed theory of the cause of the reverse short-channel effect, none of them provides a solution that satisfactorily solves or decreases the reverse short-channel effect in all cases. What is needed is a device or method to reduce the reverse short-channel effect reliably and consistently.

Therefore, in the present invention, high arsenic doses are used to lower LDD (lightly doped drain) source/drain series resistance and a light phosphorus LDD dose is used to improve the hot carrier reliability in an nLDD structure and reduce the reverse short-channel effect. The shallow nLDD junctions are formed by implanting As and P at low energies. The resulting structure is a high-performance 0.20 μm channel length CMOS logic technology operating at 2.9 V.

SUMMARY OF THE INVENTION

A semiconductor device with a semiconductor substrate, a gate oxide film formed on the semiconductor substrate, a gate electrode formed on the gate oxide film with source and drain regions formed in self-alignment with the gate electrode defining a channel region between the source and drain regions and beneath the gate electrode. The source and drain regions are made up of a first region with a first concentration of a first impurity and a second region having a second concentration of the first impurity and a third concentration of a second impurity.

The second concentration of the first impurity is lower than or equal to the first concentration of the first impurity. The second region is adjacent to an end of the channel region and the first region is adjacent to the second region.

The first impurity is arsenic and the second impurity is phosphorus.

The present invention is better understood upon consideration of the detailed description below, in conjunction with the accompanying drawings. As will become readily apparent to those skilled in this art from the following description there is shown and described a preferred embodiment of this invention simply by way of illustration of a mode best suited to carry out the invention. As it will be realized, the invention is capable of other different embodiments, and its several details are capable of modifications in various, obvious aspects all without departing from the scope of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 6:
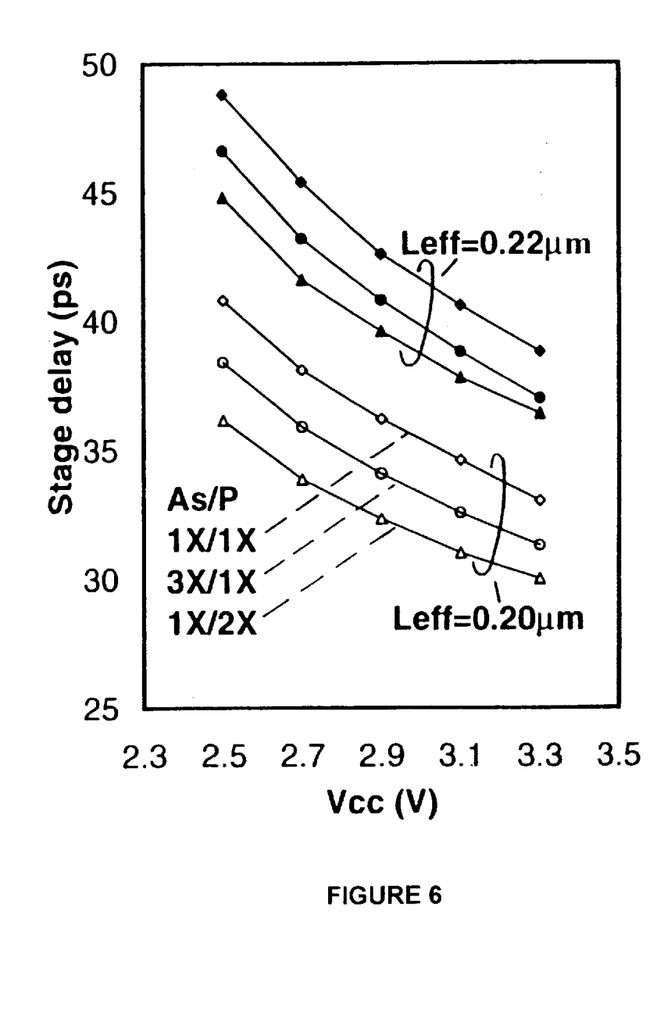
FIG. 6 is a graphical representation showing $V_{CC}$ versus stage delay.

With aggressive scaling of gate dimensions to deep submicron regime, very shallow and sharp junctions are necessary in order to maintain good short channel characteristics and current drive. Using only arsenic (As) junctions without any LDD (lightly doped drain) structure, high performance CMOS logic technology operating at 2.5 V can be achieved. Due to the sharp As junction, the power supply voltage $V_{cc}$ must be reduced to 2.5V in order to maintain sufficient hot carrier reliability margin. Although lower $V_{cc}$ is attractive in terms of power dissipation, it compromises speed and current drive. As shown in FIG. 6, the gate delay is increased by 24% when the $V_{cc}$ is reduced from 3.3 to 2.5V. In addition, at low $V_{cc}$, the threshold voltage must be lowered so that the current drive remains high, which results in high off-stage leakage.

Figure 2:
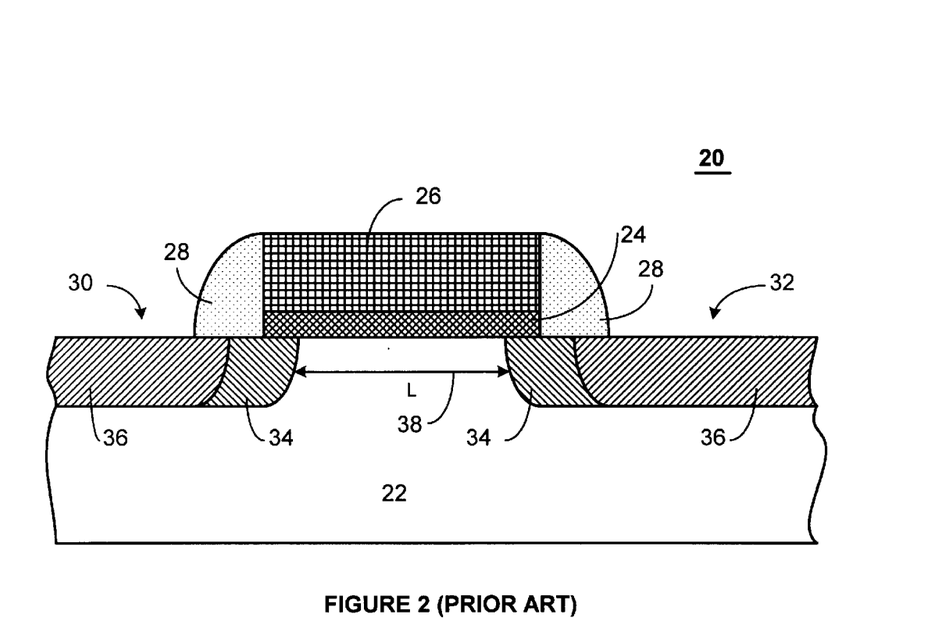
FIG. 2 is a prior art device showing an LDD MOSFET.

Referring to FIG. 2 there is shown an LDD prior art device 20. Device 20 is a MOSFET built on a semiconductor substrate 22, a layer of gate oxide 24 formed on substrate 22, and a polysilicon gate 26 formed on gate oxide layer 24. Spacers 28 are formed on the sides of gate 26 and define source and drain regions 30 and 32 respectively. Source and drain regions 30,32 each have a lightly doped region indicated by 34 and a heavily doped region indicated by 36. The channel L is indicated by 38.

Figure 3:
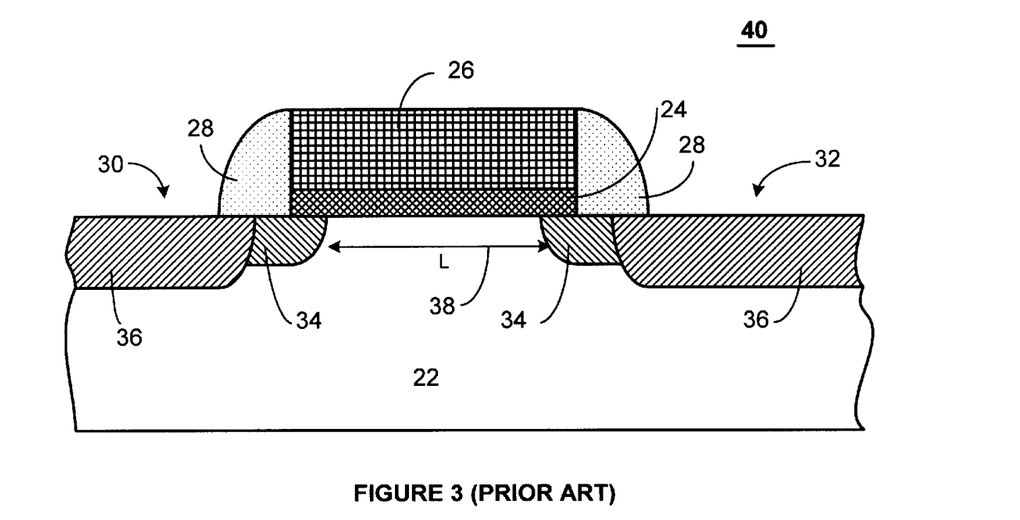
FIG. 3 is another prior art device showing an LDD MOSFET.

Referring to FIG. 3 there is shown another LDD prior art device 40. Device 40 is similar to device 20 shown in FIG. 2, therefore like numerals to indicate like components will be used in FIG. 3 as in FIG. 2. The difference between the two devices is the shape and size of the lightly doped region 34.

The prior art devices 20,40 shown in FIGS. 2 and 3 exhibit the reverse short-channel effect as discussed above in conjunction with FIG. 1. Typically, the prior art devices 20 and 40 have a p-type silicon substrate implanted with boron and low concentration regions 34 implanted with phosphorus ions at a dosage of about $10^{13}/cm^2$ and high concentration regions 36 implanted with arsenic ions at a dosage of about $10^{15}/cm^2$. Alternatively, to improve the device performance the low concentration areas 34 can be implanted with arsenic ions at a dosage of about $2-6 \times 10^{14}/cm^2$. Dosages in the $10^{14}/cm^2$ range in LDD reduces source/drain series resistance and hence improves current drive. It is found that arsenic is a better choice for improving short-channel effects because of its very low diffusivity. However, the reverse short-channel effect is not greatly improved.

Figure 4A:
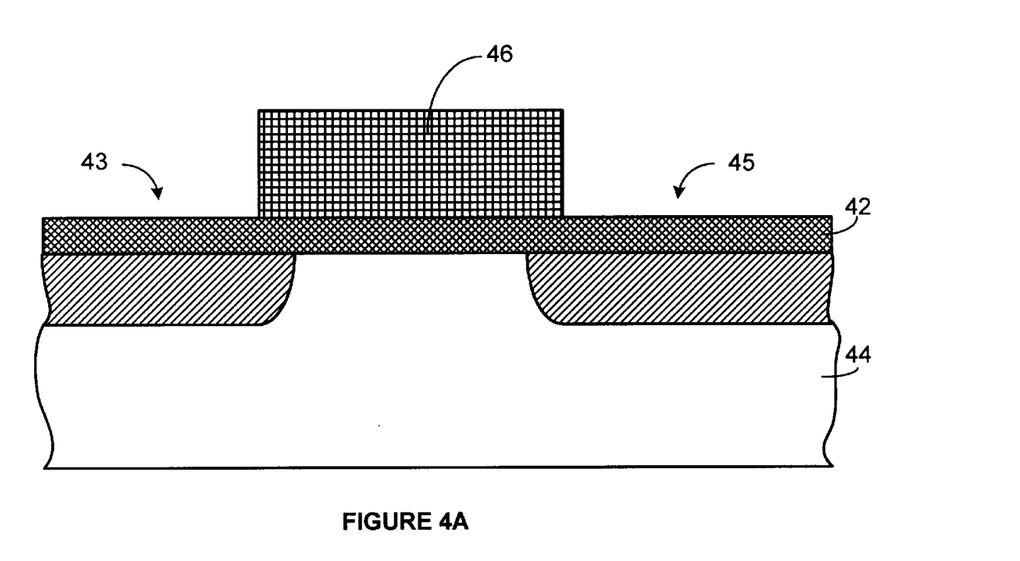
FIGS. 4A–4E illustrate the fabrication of a device of the present invention.

Referring to FIGS. 4A through 4E the fabrication of a device of the present invention will now be explained. In FIG. 4A a gate oxide layer 42 is formed on a semiconductor substrate 44. A polysilicon gate structure 46 is formed on gate oxide layer 42. The process technology used a $p^+$–epi/$p^+$ substrate, LOCOS (Local Oxidation of Silicon) isolation, dual-gate polysilicon, 7 nm gate oxide, and i-line lithography to define 0.3 $\mu$m L drawn poly lines. It is noted that other process technologies could be used.

Figure 4B:
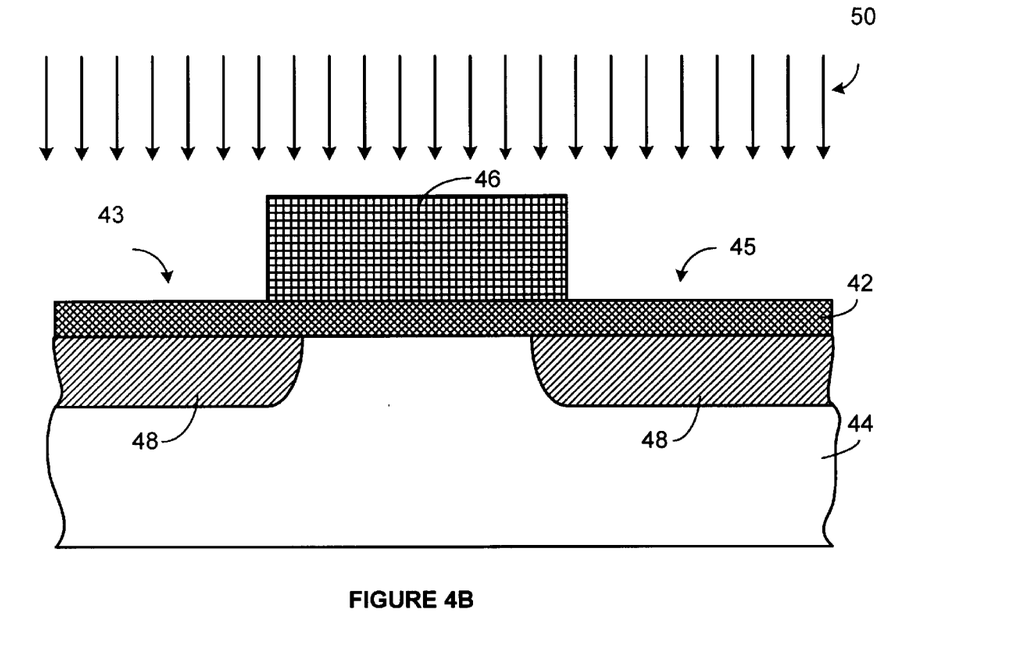

In FIG. 4B the structure as formed in FIG. 4A is implanted with arsenic ions at a dosage of $4 \times 10^{14}/cm^2$, indicated by arrows 50, until regions indicated at 48 are formed.

Figure 4C:
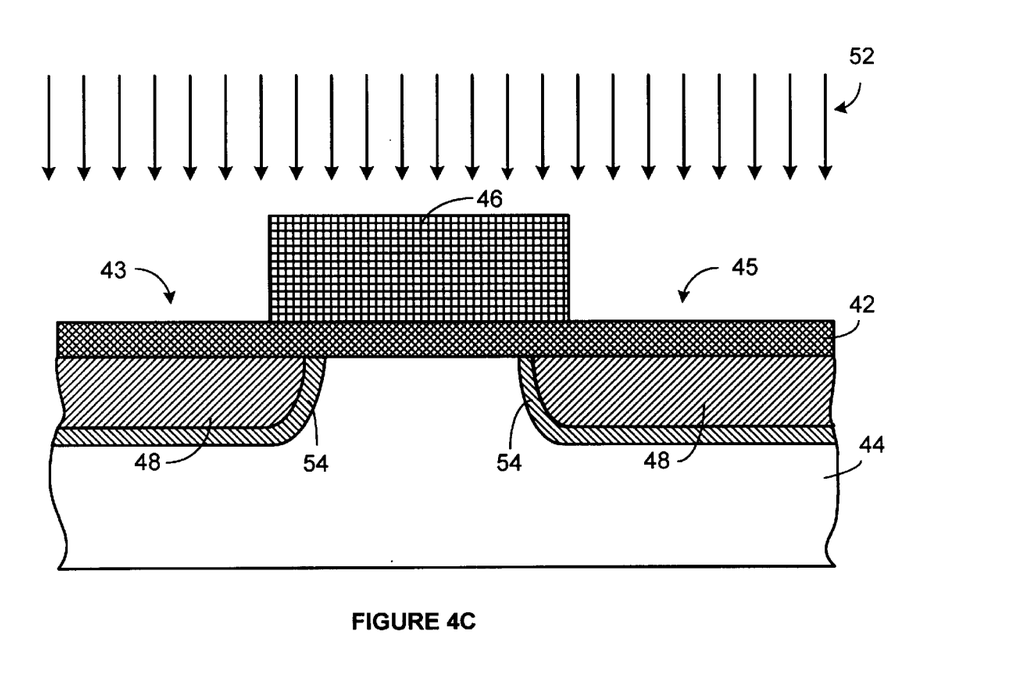

In FIG. 4C the structure as formed in FIG. 4B is implanted with phosphorus ions at a dosage of $2 \times 10^{13}/cm^2$ indicated by arrows 52 to form regions indicated at 54 reach a light concentration of phosphorus ions. After implanting the phosphorus ions, the device is subjected to a thermal anneal process, typically an RTA (rapid thermal anneal). This drives the phosphorus ions into the substrate to obtain the desired channel length and $I_{sub}$. During the drive-in step the phosphorus ions will be driven further into the substrate than the arsenic ions because arsenic ions have a lower diffusivity than phosphorus ions. The phosphorus ions will diffuse to the area indicated by 54 while the arsenic ions will only diffuse to the area indicated by 48. As can be appreciated there will be phosphorus ions remaining in the area indicated by 48 and therefore the area indicated by 48 will have both arsenic ions and phosphorus ions.

The use of a light concentration of phosphorus ions in nLDD provides (1) a lowering of $I_{sub}$ to improve hot carrier reliability, (2) achieving desired $L_{eff}$ as arsenic ions do not move to an appreciable extent due to their low diffusivity, and (3) a diminishing of the short channel effects.

Figure 4D:
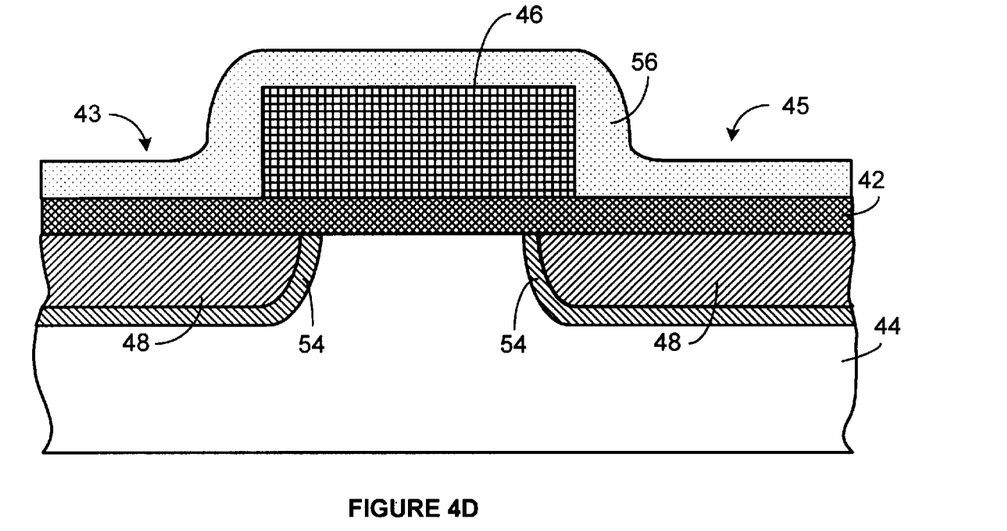
Figure 4E:
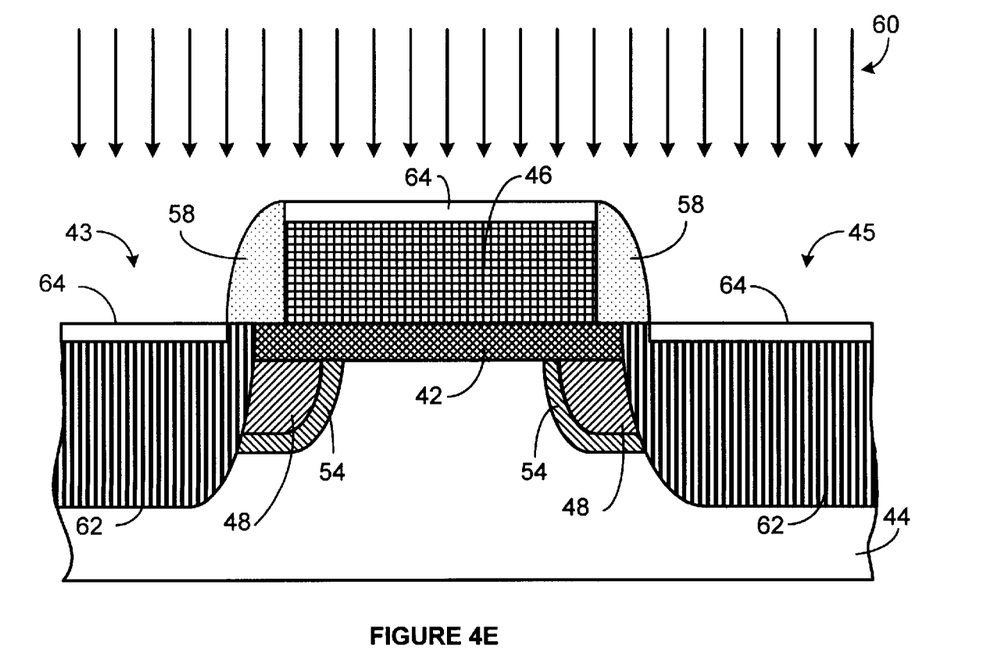

In FIG. 4D a layer of silicon oxide 56 is deposited on the structure formed in FIG. 4C. In FIG. 4E spacers 58 are formed on the sides of polysilicon gate 46 by etching layer 56 (FIG. 4D). The structure is then implanted with arsenic ions at a dosage of $3 \times 10^{15}/cm^2$, indicated by arrows 60 until regions indicated at 62 reach a heavy concentration of arsenic ions. The resulting structure has a first region indicated by 62 and a second region represented by a first portion 48 and a second portion 54 where second portion 54 includes the first portion 48.

Self-aligned Ti Salicide, indicated at 64 is formed over gate 46, source region 43 and drain region 45. The resulting $n^-$ and $p^-$ TiSi$_2$ sheet rho is 3–4 $\Omega$/square. In this technology, total source+drain series resistance is 390 $\Omega/\mu$m.

Figure 5:
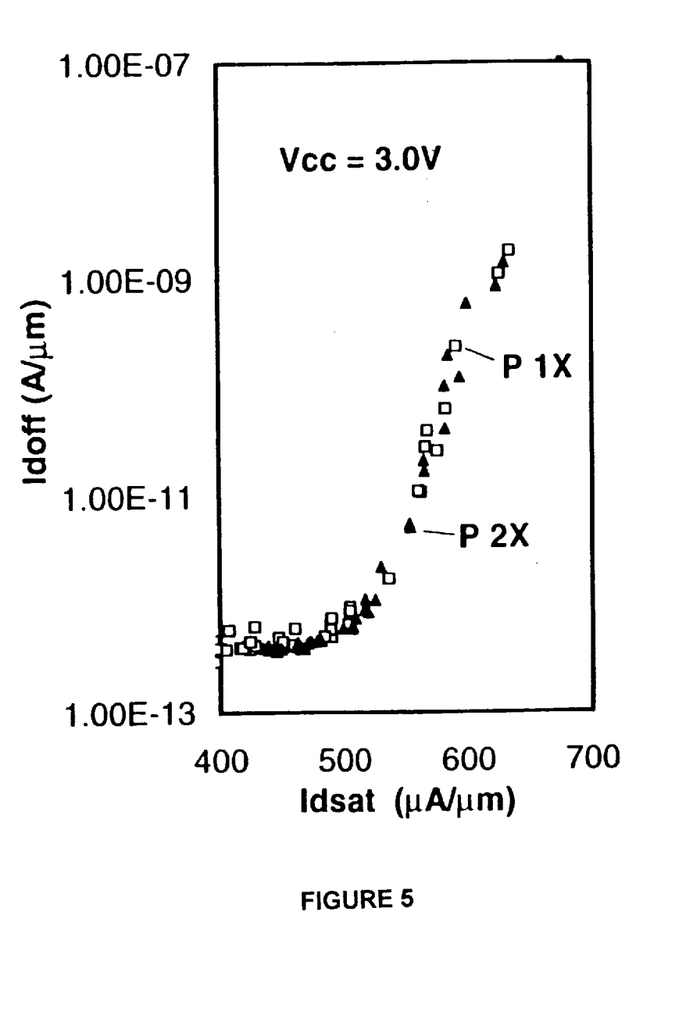
FIG. 5 is a graphical representation showing $I_{doff}$ versus $I_{dsat}$.
Figure 7:
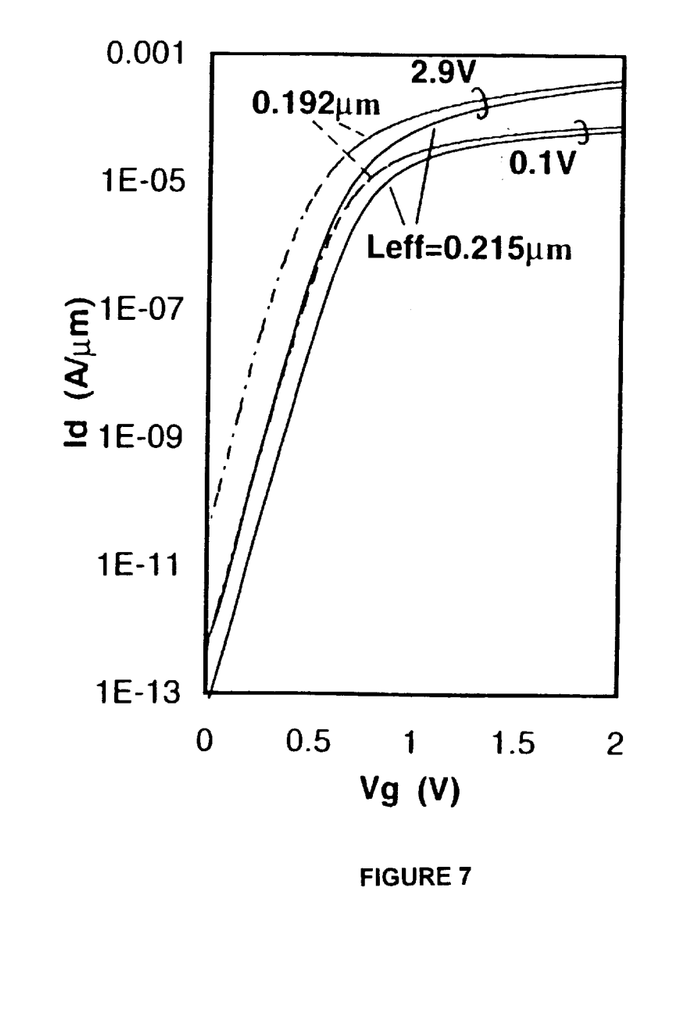
FIG. 7 is a graphical representation showing $V_g$ versus $I_D$ for nMOS.
Figure 8:
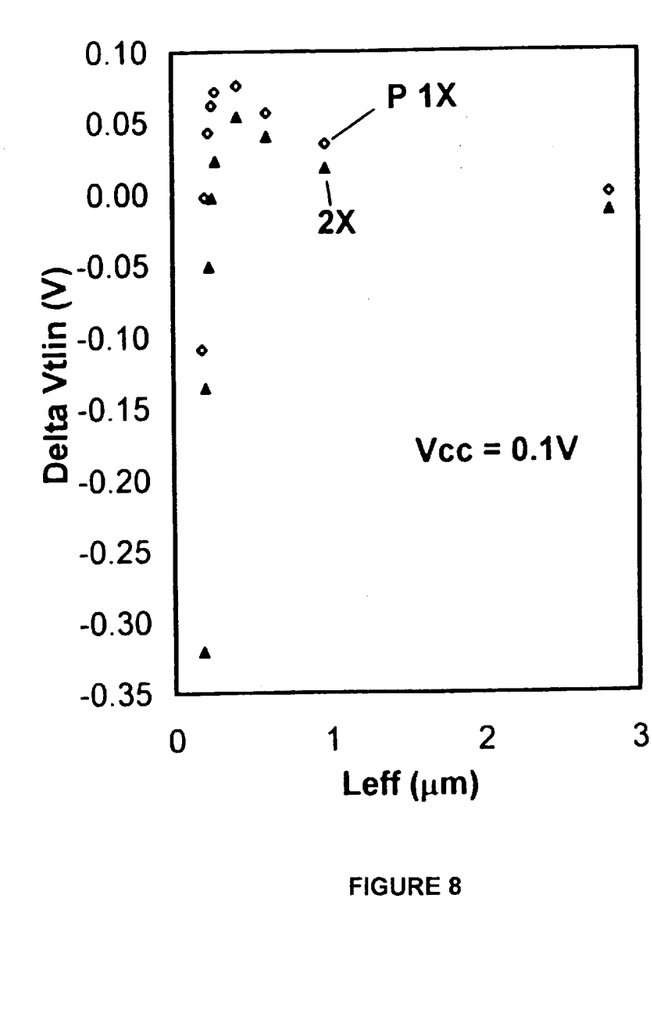
FIG. 8 is a graphical representation showing $L_{eff}$ versus delta Vtlin for nMOS.

The measured results for the above device will now be discussed. From the universal $I_{doff}$–$I_{dsat}$ curve, FIG. 5, it is seen that the addition of a light concentration of phosphorus ions added to a high concentration of arsenic ions in nLDD does not alter the $I_{doff}$–$I_{dsat}$ characteristics. The subthreshold characteristics for n-channel devices are shown in FIG. 7. At 0.192 $\mu$m channel length, subthreshold slope is 80 mV/decade and leakage is <30 pA/$\mu$m at 2.9 V. This leakage is much smaller than that reported by W. H. Chang, et al. IEEE ED, Vol. 39, p. 959, 1992, using only As nLDD (>100 pA/$\mu$m at 2.5 V for the 0.25 $\mu$m channel length device). As reported by C. S. Rafferty, et al. IEDM Tech. Digest, p. 311, 1993 and J. Lutze and S. Venkatesan, IEEE EDL. p. 373, 1995, the reverse short channel effects become pronounced for very short channel devices. As shown in FIG. 8, delta Vtlin (linear threshold voltage) becomes greater than 0 V for short channel devices when referenced to the Vtlin for the long channel device. Adding a light concentration of phosphorus ions to a heavy concentration of arsenic ions in nLDD can significantly reduce this effect as shown in FIG. 8.

Figure 9:
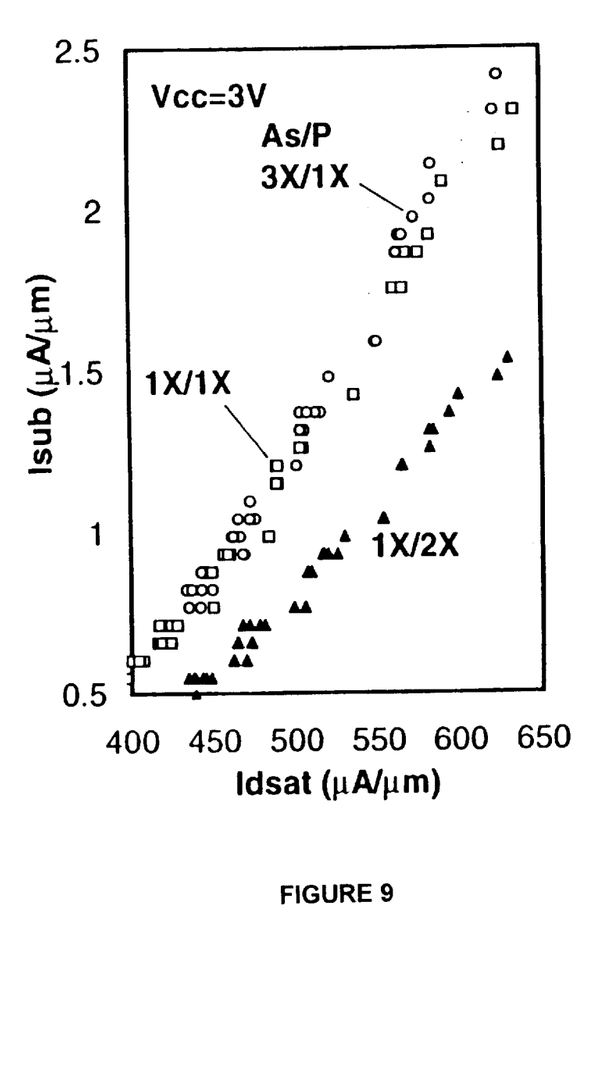
FIG. 9 is a graphical representation showing $I_{dsat}$ versus $I_{sub}$ for nMOS.
Figure 10:
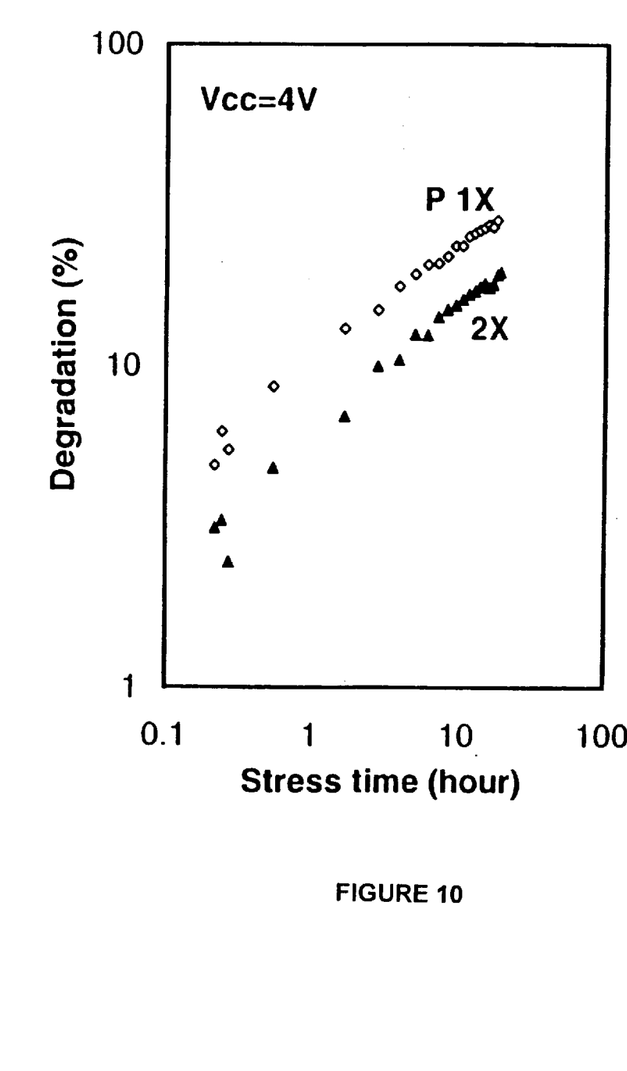
FIG. 10 is a graphical representation showing stress time versus device degradation.
Figure 11:
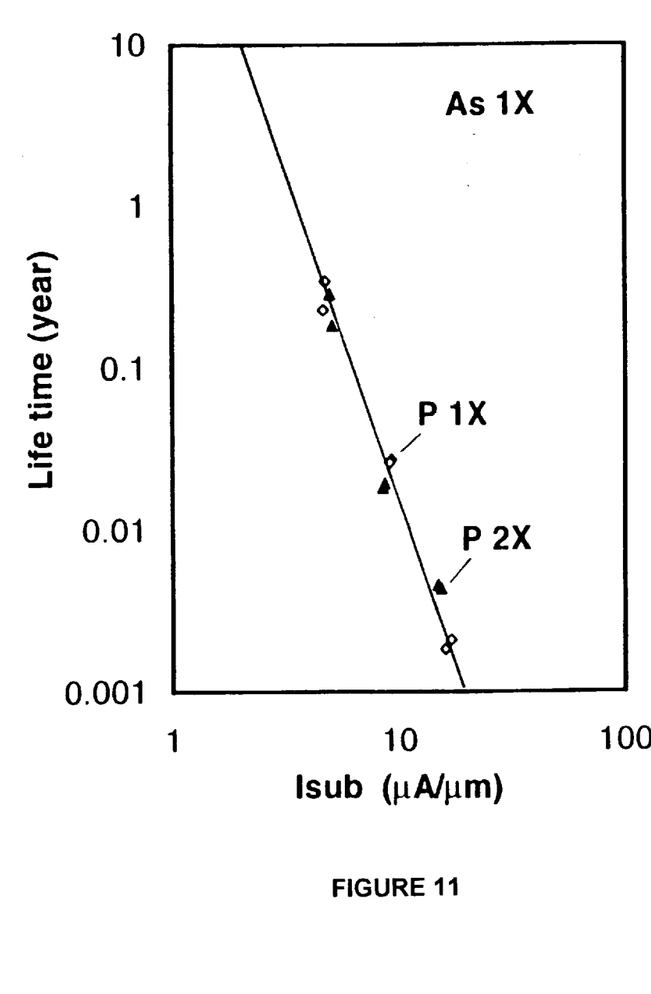
FIG. 11 is a graphical representation showing $I_{sub}$ versus life time for nMOS.
Figure 12:
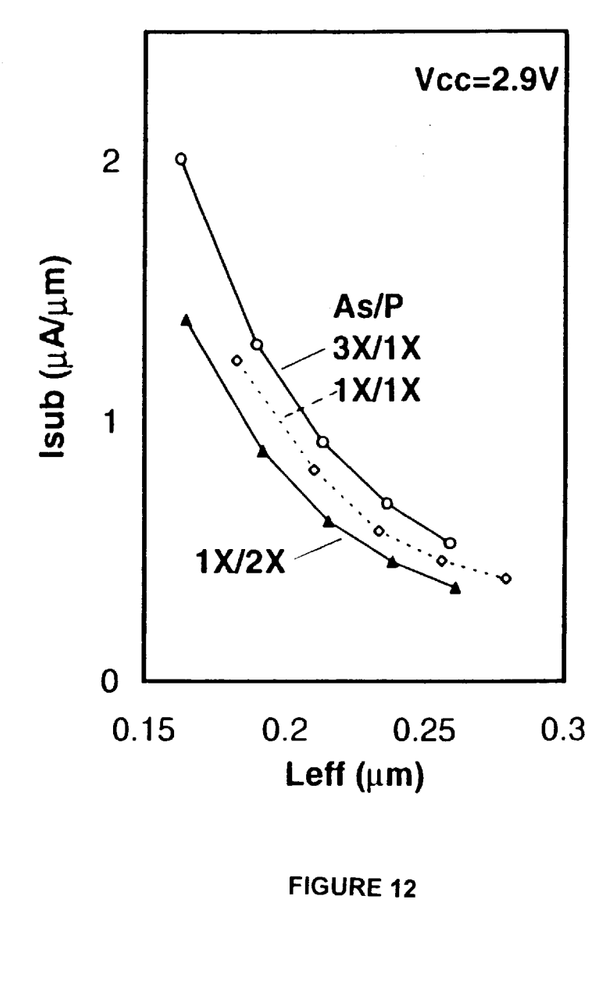
FIG. 12 is a graphical representation showing $L_{eff}$ versus $I_{sub}$ for nMOS.

Adding a light concentration of phosphorus ions to a heavy concentration of arsenic ions in nLDD dramatically improves hot carrier reliability. For a constant $I_{dsat}$, maximum $I_{sub}$ decreases significantly when the phosphorus ion concentration is doubled, see FIG. 9, whereas tripling the arsenic ion concentration causes $I_{sub}$ to increase only marginally. As shown in FIG. 10, the degradation of linear current with an increasing phosphorus ion concentration clearly decreases for the higher phosphorus ion concentration. The long-term stress results for $I_{dsat}$ are presented in FIG. 11. In order to achieve 10 years dc hot carrier life time for n-channel transistors, the maximum $I_{sub}$ current must be kept below 2 $\mu$A /$\mu$m, FIG. 11. Optimum implant conditions gives the maximum $I_{sub}$ of 1.4 $\mu$A/$\mu$m at 2.9V for the 0.17 $\mu$m device, FIG. 12. This demonstrates that dc life time exceeding 10 years can be achieved for devices as small as 0.17 $\mu$m.

The foregoing description of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

We claim:

1. A semiconductor device having a reduced reverse short-channel effect, comprising:

a semiconductor substrate of a first conductivity type;

a gate oxide film formed on said semiconductor substrate;

a gate electrode formed on said gate oxide film; and source and drain regions of a second conductivity type formed in said substrate in self-alignment with said gate electrode with a channel region thereby defined in said substrate between said source and drain regions; wherein at least said drain region of said source and drain regions comprises a first region formed by a first implantation of a first impurity at a dosage of approximately $3 \times 10^{15}$ ions per cm$^2$, a second region formed by a second implantation of the first impurity at a dosage of approximately $4 \times 10^{14}$ ions per cm$^2$ and by a first implantation of a second impurity at a dosage of approximately $2 \times 10^{13}$ ions per cm$^2$, whereby the reverse short-channel effect is reduced.

2. The semiconductor device of claim 1 wherein said second region comprises a first portion and a second portion and wherein said second portion includes said first portion.

3. The semiconductor device of claim 2, wherein said first portion contains ions of said first impurity implanted at a dosage of approximately $4 \times 10^{14}$ ions per cm$^2$ and wherein said second portion contains ions of said second impurity implanted at a dosage of approximately $2 \times 10^{13}$ ions per cm$^2$.

4. The semiconductor device of claim 3, wherein said second portion of said second region is adjacent to an end of said channel region.

5. The semiconductor device of claim 2, wherein said first impurity is arsenic.

6. The semiconductor device of claim 5, wherein said second impurity is phosphorus.

7. The semiconductor device of claim 6, further comprising a sidewall spacer formed on each side of said gate electrode.

* * * * *